(12) United States Patent
Satou

(10) Patent No.: US 9,851,761 B2
(45) Date of Patent: Dec. 26, 2017

(54) COMPUTER AND HIGH-DENSITY SERVER ACCOMMODATING MULTIPLE MODULES

(71) Applicant: NEC Corporation, Minato-ku, Tokyo (JP)

(72) Inventor: Tasuku Satou, Tokyo (JP)

(73) Assignee: NEC CORPORATION, Tokyo (JP)

( * ) Notice: Subject to any disclaimer, the term of this patent is extended or adjusted under 35 U.S.C. 154(b) by 288 days.

(21) Appl. No.: 14/670,025

(22) Filed: Mar. 26, 2015

(65) Prior Publication Data

US 2015/0331458 A1 Nov. 19, 2015

(30) Foreign Application Priority Data

May 14, 2014 (JP) .................................. 2014-100281

(51) Int. Cl.
*G06F 13/00* (2006.01)
*G06F 13/12* (2006.01)
(Continued)

(52) U.S. Cl.
CPC ................ *G06F 1/183* (2013.01); *G06F 1/18* (2013.01); *G06F 1/28* (2013.01); *H05K 7/10* (2013.01);
(Continued)

(58) Field of Classification Search
None
See application file for complete search history.

(56) References Cited

U.S. PATENT DOCUMENTS 5,375,084 A * 12/1994 Begun ................. G06F 12/0684
365/230.03
6,035,345 A * 3/2000 Lee ....................... H03K 17/693
710/316
(Continued)

FOREIGN PATENT DOCUMENTS

JP 08-213994 A 8/1996
JP 2004-171599 A 6/2004
(Continued)

OTHER PUBLICATIONS

Technical White Paper, "HP Moonshot System", World First "Software Defined Server", Apr. 2013, Hewlett-Packard Development Company, L.P., URL:http://h50146.www5.hp.com/products/servers/proliant/whitepaper/wp160-1305c/pdfs/TC1304964.pdf with English version.
(Continued)

*Primary Examiner* — David E Martinez

(57) ABSTRACT

A computer, serving as a high-density server, includes a substrate, a plurality of connectors each including a plurality of electrodes, and a plurality of modules detachably attached to the substrate via connectors. The modules are attached to the connectors via different combinations of electrodes such that a first module (e.g. a CPU) is attached to one connector via a first combination of electrodes while a second module (e.g. a storage module or an attachment module) is attached to another connector via a second combination of electrodes. The connectors are aligned in a first direction on the substrate or in an array defined by first and second directions perpendicular to each other, wherein the connectors are selectively and electrically connected together with electrodes.

3 Claims, 11 Drawing Sheets

(51) Int. Cl.
*G06F 13/38* (2006.01)
*G06F 1/18* (2006.01)
*H05K 7/10* (2006.01)
*G06F 1/28* (2006.01)

(52) U.S. Cl.
CPC . *G06F 2200/1635* (2013.01); *Y10T 29/49906* (2015.01)

(56) References Cited

U.S. PATENT DOCUMENTS

| | | | | |
|---|---|---|---|---|
| 2008/0082751 A1* | 4/2008 | Okin | ............... | G06F 13/1668 711/115 |
| 2010/0125689 A1* | 5/2010 | Chang | ............... | G06F 13/387 710/301 |
| 2012/0144072 A1* | 6/2012 | Hansson | ............... | H04R 1/1033 710/15 |
| 2014/0017912 A1* | 1/2014 | Ha | ............... | H01R 12/73 439/74 |

FOREIGN PATENT DOCUMENTS

| JP | 2004-206462 A | 7/2004 |
|---|---|---|
| JP | 2006-301824 A | 11/2006 |
| WO | 2012/132202 A1 | 10/2012 |

OTHER PUBLICATIONS

Japanese Office Action for JP Application No. 2014-100281 dated Sep. 1, 2015 with English Translation.

* cited by examiner

COMPUTER AND HIGH-DENSITY SERVER ACCOMMODATING MULTIPLE MODULES

BACKGROUND OF THE INVENTION

Field of the Invention

The present invention relates to a computer and a high-density server accommodating a plurality of modules.

The present application claims priority on Japanese Patent Application No. 2014-100281, the entire content of which is incorporated herein by reference.

Description of the Related Art

Computers including a plurality of modules in a single housing have been developed and designed to include multiple types of slots accommodating multiple types of modules such as slots connectable to CPU modules, slots connectable to storage modules, and slots connectable to I/O modules.

Various technologies regarding computers and high-density servers have been disclosed in various documents. Patent Literature Document 1 discloses a configuration management method of an ATM electronic exchange system configured to incorporate either a high-speed interface package or a low-speed interface package therein. The ATM electronic exchange system includes a controller configured to automatically recognize the installation of each package and the type of each package. Patent Literature Document 2 discloses an extended module adding method of an input/output control device in which an extended module can be added by means of a connector configured to connect backboards of modules. Patent Literature Document 3 discloses a complex computer system using blade servers with processor modules having a plurality of CPU slots. Herein, a plurality of extended I/O card slots can be formed in an I/O module for extended I/O cards. Moreover, Non-Patent Literature Document 1 discloses "HP Moonshot System" regarding "HP Moonshot 1500 Chassis", and "HP Proliant Moonshot Server" as products of software defined servers.

It is preferable to further increase the density of assembling modules and miniaturizing the size of computers installing a plurality of modules. To realize high-density and small-size computers, it is necessary to reduce the number of empty slots to be as small as possible. The foregoing computers are designed to install the same type of modules having the same layout of electrodes for connectors, such as high-speed communication modules and low-speed communication modules, in the same slot. Considering the future extensibility of further adding modules in computers, it is necessary to prepare en empty slot for each system. However, this may increase the amount of empty space in computers.

CITATION LIST

Patent Literature

Patent Literature Document 1: Japanese Patent Application Publication No. H08-213994
Patent Literature Document 2: Japanese Patent Application Publication No. 2004-206462
Patent Literature Document 3: Japanese Patent Application Publication No. 2006-301824

Non Patent Literature

Non-Patent Literature 1: Technical White Paper, "HP Moonshot System", World First "Software Defined Server", April 2013, Hewlett-Packard Development Company, L.P., URL: http://h50146.www5.hp.com/products/servers/proliant/whitepaper/wp160-1305c/pdfs/TC1304964.pdf

SUMMARY OF THE INVENTION

It is an object of the present invention to provide a computer and a high-density server accommodating a plurality of modules without increasing the amount of empty space.

In a first aspect, the present invention is directed to a computer including a substrate, a plurality of connectors each including a plurality of electrodes, and a plurality of modules detachably attached to the substrate via a plurality of connectors. The modules are attached to the connectors via different combinations of electrodes such that a first module is attached to one connector via a first combination of electrodes while a second module is attached to another connector via a second combination of electrodes.

In a second aspect, the present invention is directed to a server including the above computer.

In a third aspect, the present invention is directed to a module serving as each of a first module and a second module detachably attached to a plurality of connectors formed on a substrate.

In a fourth aspect, the present invention is directed to an assembling method of the above computer, wherein the modules are attached to the connectors via different combinations of electrodes such that the first module is attached to one connector via a first combination of electrodes while a second module is attached to another connector via a second combination of electrodes.

In a fifth aspect, the present invention is directed to a control method adapted to the above computer including a detection step applied to the first module to detect the attached condition of the first module attached to one connector; a transmission step applied to the first module to transmit a reply request signal for each combination of electrodes towards the connectors adjacent to one connector in the attached condition of the first module; a reception step applied to the second module to receive the reply request signal from the first module; a reply transmission step applied to the second module, receiving the reply request signal, to transmit a reply signal via each combination of electrodes used to receive the reply request signal; a reply reception step applied to the first module to receive the reply signal via each combination of electrodes in the predetermined time after transmitting the reply request signal; and a communication start step to start communication via each combination of electrodes used to receive the reply signal.

In a sixth aspect, the present invention is directed to a communication start control method adapted to the above computer. Specifically, a communication start control method applied to the first module includes a detection step to detect the attached condition of the first module attached to one connector; a transmission step to transmit a reply request signal for each combination of electrodes towards the connectors adjacent to one connector in the attached condition of the first module; a reply reception step to receive a reply signal via each combination of electrodes in the predetermined time after transmitting the reply request signal; and a communication start step to start communication with the second module via each combination of electrodes used to receive the reply signal. Additionally, a communication start control method applied to the second module includes a reception step to receive the reply request signal from the first module; a reply transmission step to transmit a reply signal via each combination of electrodes used to receive the reply request signal in response to the reply request signal; and a communication start step to start communication with the first module via each combination of electrodes used to transmit the reply signal.

According to the present invention, it is possible to demonstrate a computer serving as a high-density server accommodating various types of modules without increasing the amount of empty space.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENT

The present invention will be described in further detail by way of examples with reference to the accompanying drawings.

1. First Embodiment

Figure 1:
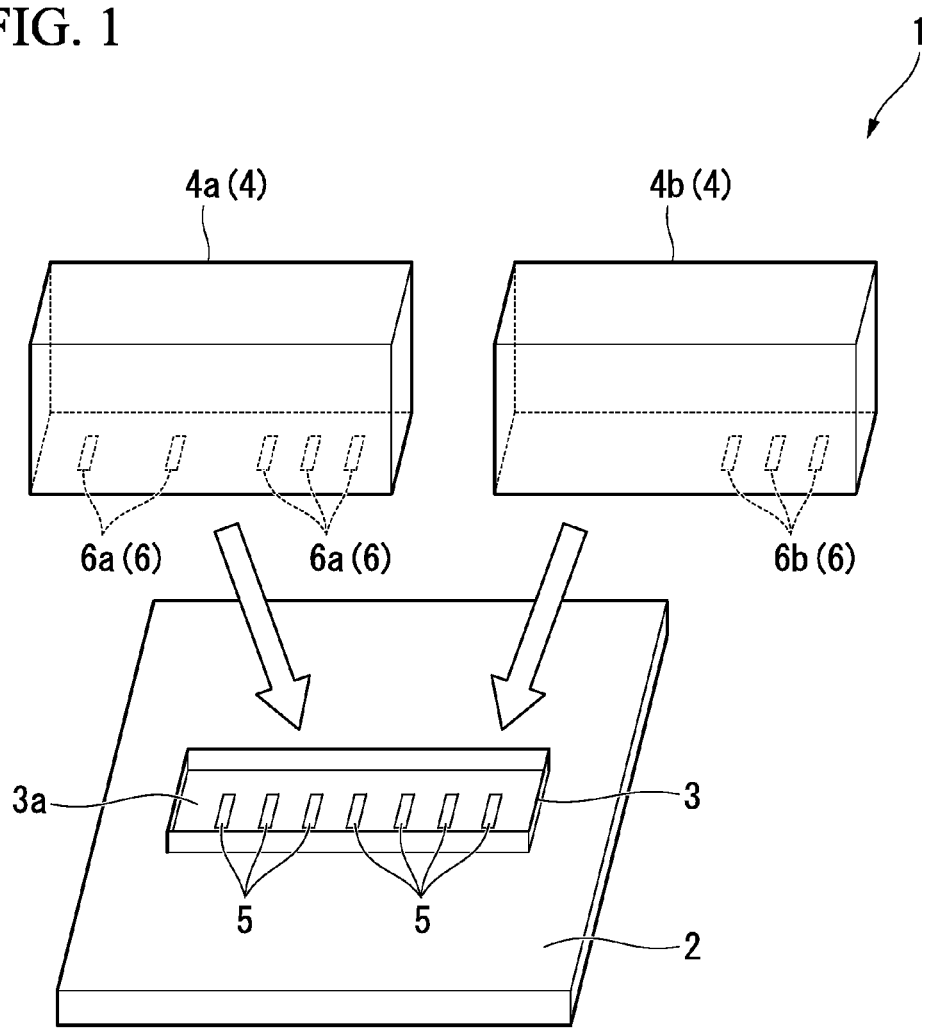
FIG. 1 is a perspective view showing the configuration of a computer according to the first embodiment of the present invention.

FIG. 1 is a perspective view showing the configuration of a computer 1 according to the first embodiment of the present invention. The computer 1 includes a substrate 2, a connector 3, and modules 4 (i.e. 4a, 4b). For example, the computer 1 is applicable to a complex high-density server incorporating a plurality of server units.

The substrate 2 is configured of a PCB (Printed Circuit Board) or the like. The substrate 2 is installed in housing (not shown). The substrate 2 includes printed wiring (not shown) connected to the connector 3. As the substrate 2, it is possible to use a multiple-layered printed-circuit board. Additionally, the substrate 2 includes power wiring (not shown) configured to supply a drive power to the modules 4. The power wiring is connectable to the modules 4 via the connector 3.

The connector 3 is fixed onto the substrate 2. The connector 3 is electrically connectable to the modules 4 while mechanically supporting the modules 4. The connector 3 includes a plurality of electrodes 5. The electrodes 5 are aligned and exposed on an electrode layout face 3a such as the base of the connector 3. The electrodes 5 are connected to the printed wiring of the substrate 2 serving as transmission lines. Wires connected electrodes 5 are connected to the substrate 2 and other electronic devices arranged outside the computer 1.

The module 4 has hardware and software such as programs so as to achieve various functions. The computer 1 of the first embodiment includes a first module 4a and a second module 4b having different functions. The first modules 4a and the second module 4b are detachably connected to the connector 3. The first module 4a and the second module 4b include module electrodes 6 (i.e. 6a, 6b) on the lower faces positioned opposite to the electrode layout face 3a of the connector 3.

Each of the module electrodes 6a of the first module 4a is electrically connected to the counterpart electrode 5 among the electrodes 5 of the connector 3 when the first module 4a is attached to the connector 3. Similarly, each of the module connectors 6b of the second module 4b is electrically connected to the counterpart electrode 5 among the electrodes 5 of the connector 3 when the second module 4b is attached to the connector 3.

The module electrodes 6a of the first module 4a and the module electrodes 6b of the second module 4b are electrically connected to different combinations of electrodes 5 in the connector 3. For example, the module electrodes 6 are connected to the electrodes 5 of the connector 3 differently such that the module electrodes 6a are connected to the first and third electrodes 5 while the module electrodes 6b are connected to the first and second electrodes 5.

The first embodiment is designed such that the first module 4a and the second module 4b may share parts of electrodes 5 in the connector 3; but this is not a restriction. Additionally the first embodiment is designed to use a pair of electrodes 5 in connection with a pair of module electrodes 6; but this is not a restriction. That is, the module electrodes 6 of the modules 4a and 4b can be electrically connected to different combinations of electrodes 5 of the connector 3 such that a combination of three or more module electrodes 6 is electrically connected to a combination of three or more electrodes 5. Alternatively, it is possible to electrically connect different combinations of electrodes 5 to the module electrodes 6a and 6b of the modules 4a and 4b. Moreover, the number of electrodes 5 connectable to the module electrodes 6a of the first module 4a may differ from the number of electrodes 5 connected to the module electrodes 6b of the second module 4b. Herein, it is possible to selectively combine the wires connected to the electrodes 5 so as to form transmission lines depending on the functions of the modules 4.

In the computer 1 of the first embodiment including a single connector 3 which can be selectively connected to the first module 4a and the second module 4b, it is possible to electrically connect the first module 4a and the second module 4b to different combinations of electrodes 5 in the connector 3. Thus, it is possible to selectively form a desired transmission line for each function of each module 4. This improves the general-purpose property of the connector 3. Additionally, it is possible to achieve a high-density server without increasing the amount of empty space in the computer 1.

The first embodiment is directed to the computer 1 including two types of modules 4, i.e. the first module 4a and the second module 4b; but this is not a restriction. It is possible for the computer 1 to include three or more modules 4. In this connection, the shapes of the connector 3 and the modules 4 are not necessarily limited to the shapes shown in FIG. 1.

2. Second Embodiment

Next, a computer 101 according to the second embodiment of the present invention will be described with reference to FIG. 2. The computer 101 differs from the computer 1 in terms of the number of connectors 3; hence, parts identical to those shown in FIG. 1 are specified using the same reference signs.

Figure 2:
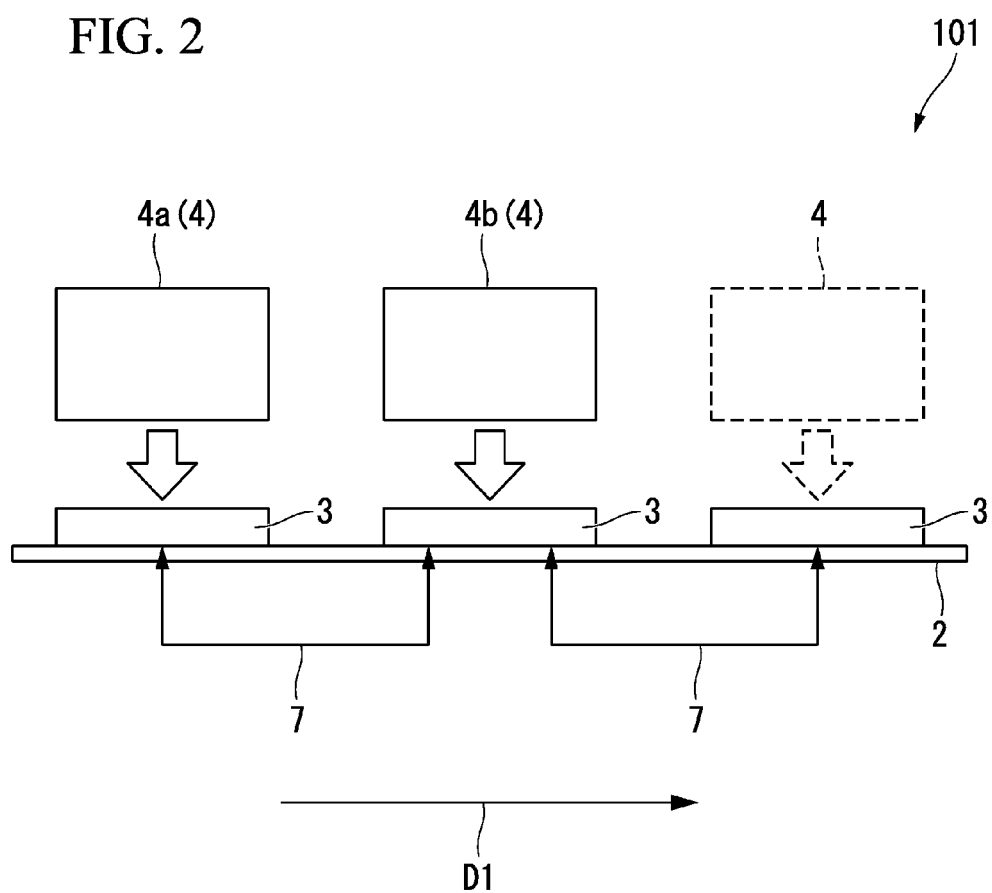
FIG. 2 is a front view of a computer according to the second embodiment of the present invention.

FIG. 2 is a front view of the computer 101 according to the second embodiment of the invention. The computer 101 includes a substrate 2, connectors 3, and modules 4. Similar to the computer 1, the substrate 2 of the computer 101 includes various wires 7.

A plurality of connectors 3 is linearly aligned in a first direction D1 along with the surface of the substrate 2. The connectors 3 are slightly distanced from each other via the predetermined interval in the first direction D1. The connectors 3 include electrodes 5 (not shown in FIG. 2) which are electrically connected to each other via the wires 7 formed on the substrate 2.

The electrodes 5 of each connector 3 are connected to the counterpart electrodes 5 of the adjacent connector 3. For example, the first electrode 5 of each connector 3 may be connected to the first electrode 5 of the adjacent connector 3 while the second electrode 5 of each connector may be connected to the second electrode 5 of the adjacent connector 3. In this connection, it is possible to set a blank electrode as an n-th electrode 5 of the connector 3 arbitrarily selected from among the connectors 3. That is, it is possible to compulsorily deactivate the "blank" electrode 5 in the connectors 3 adjacently aligned together.

The computer 101 of the second embodiment includes three connectors 3 aligned in the first direction D1; but this is not a restriction. The second embodiment needs a plurality of connectors 3 adjacently aligned together; hence, the number of connectors 3 is not necessarily limited to three.

The computer 101 employs the modules 4 which are identical to the modules 4 of the computer 1. The module 4 includes hardware and software such as programs to achieve various functions. The computer 101 is able to use two types of modules 4, i.e. the first module 4a and the second module 4b having different functions. When the first module 4a and the second module 4b are attached to the connector 3, the module electrodes 6a and 6b (not shown in FIG. 2) are electrically connected to different combinations of electrodes 5 in the connectors 3.

In this connection, it is possible to prepare plural sets of the modules 4a and 4b. All the modules 4a and 4b can be detachably connected to the connectors 3.

In the computer 101, it is possible to electrically connect the modules 4, aligned in the first direction D1, via the electrodes 5 of the connectors 3 such that the first module 4a and the second module 4b are appropriately attached to the connectors aligned on the substrate 2. As a result, it is possible to easily configure a desired unit combining a plurality of modules 4.

The second embodiment is directed to the computer 101 including two types of modules 4, i.e. the first module 4a and the second module 4b; but this is not a restriction. It is unnecessary to attach different types of modules 4 to the connectors 3. For example, it is possible to attach a plurality of first modules 4a to the connectors 3, or it is possible to attach a plurality of second modules 4b to the connectors 3. Of course, it is possible to combine the modules 4a and 4b in connection with the connectors 3.

3. Third Embodiment

Figure 3:
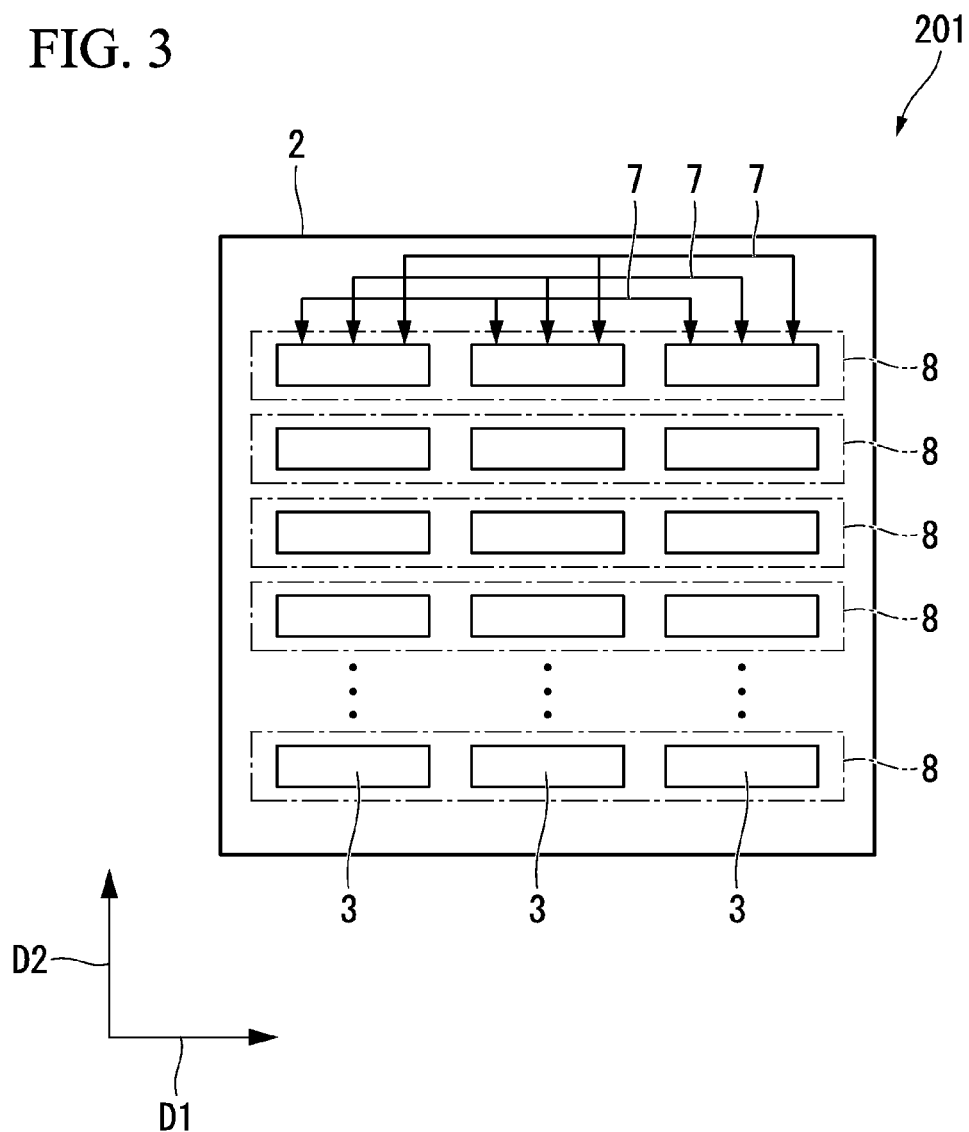
FIG. 3 is a plan view of a computer according to the third embodiment of the present invention.

Next, a computer 201 according to the third embodiment of the present invention will be described with reference to FIG. 3. The computer 201 differs from the computer 101 in that the connectors 3 are aligned in a two-dimensional array defined by first and second directions D1 and D2. In FIG. 3, parts identical to those shown in FIGS. 1 and 2 are specified using the same reference signs.

FIG. 3 is a plan view of the computer 201 according to the third embodiment of the present invention. The computer 201 includes a substrate 2, connectors 3, and modules (not shown in FIG. 3). The module 4 has the same configuration as the module 4 used in the first and second embodiments; hence, the description thereof will be omitted.

A plurality of connectors 3 is fixed onto the substrate 2. The connectors 3 are aligned in a two-dimensional array such that a first set of connectors 3 is aligned in each row corresponding to the first direction D1 while a second set of connectors 3 is aligned in each column corresponding to the second direction D2 perpendicular to the first direction D1 on the surface of the substrate 2. In this connection, the second direction D2 is not necessarily perpendicular to the first direction D1. Additionally, the number of connectors aligned in each row and the number of connectors aligned in each column are illustrative and not restrictive.

The connectors 3 include the electrodes 5 (not shown in FIG. 3) which are connected together via the wires 7 formed on the substrate 2. Specifically, a plurality of connectors 3 aligned in the first direction D1 is electrically connected together, but a plurality of connectors 3 aligned in the second direction D2 is not electrically connected together.

Additionally, the connectors 3 are each elongated in length in the first direction D1 in a plan view. That is, the lengthwise direction of each connector 3 is directed in the first direction D1; hence, the module 4 attached to the connector 3 is elongated in length in correspondence with the connector 3. In FIG. 3, the connector 3 has a rectangular shape in a plan view; but this is not a restriction. For example, it is possible to form the connector 3 in a polygonal shape or an elliptical shape in a plan view.

A plurality of connectors 3 is aligned in the first direction D1 to form a connector group 8 encompassed by dashed lines on the substrate 2 of the computer 201. That is, the electrodes 5 of the connectors 3 are mutually connected together in each connector group 8. For this reason, it is possible for engineers to easily grasp connectors 3 electrically connecting the modules 4 together in view of the first direction D1 even when a plurality of connectors 3 is aligned in a two-dimensional array on the substrate 2. Additionally, it is possible for engineers to easily grasp the first direction D1 in view of the lengthwise direction of each connector 3 since the lengthwise direction of each connector 3 is directed to the first direction D1.

Figure 4:
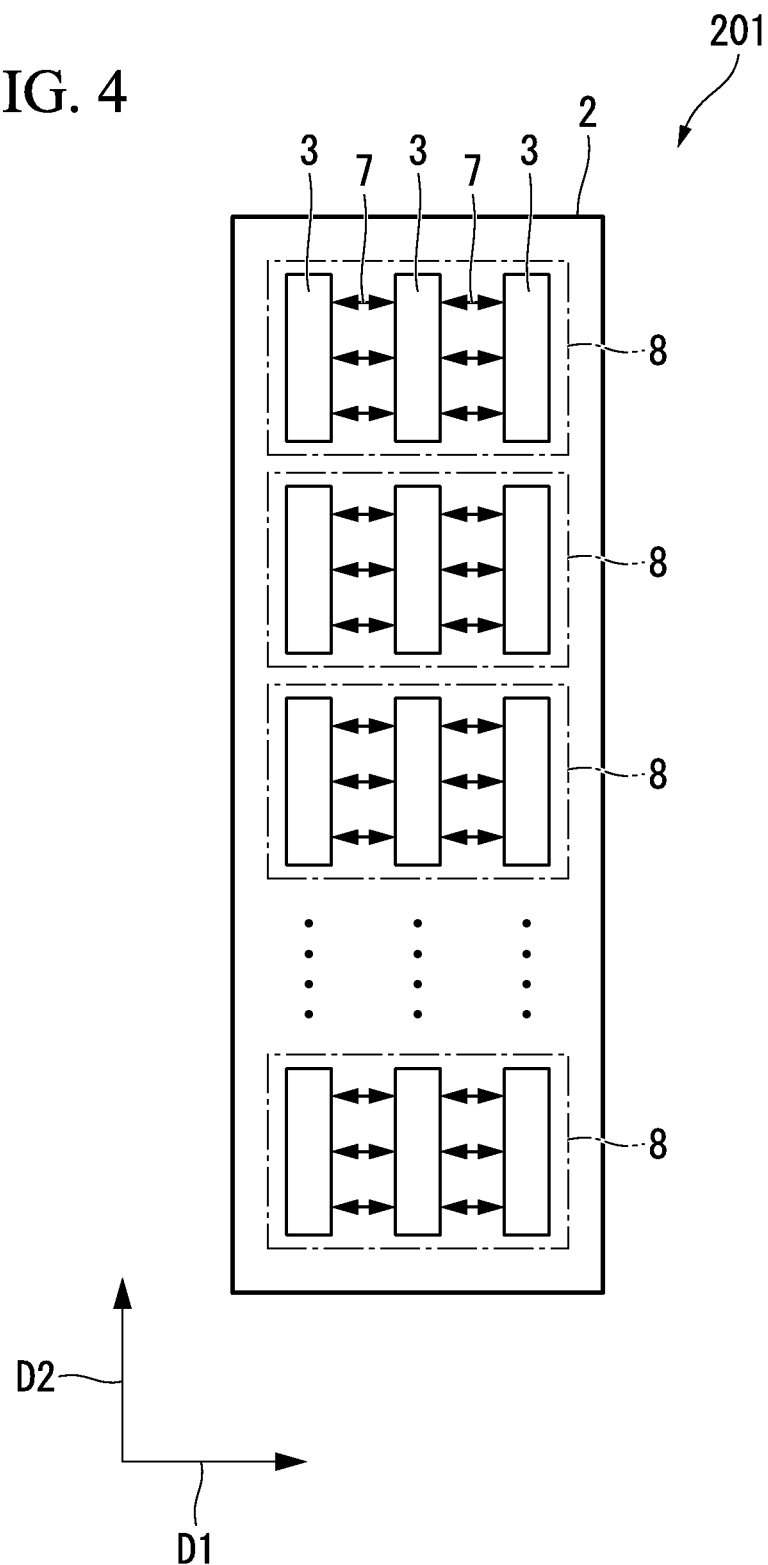
FIG. 4 is a plan view showing a modified example of the third embodiment shown in FIG. 3.

The third embodiment is directed to the computer 201 in which the lengthwise direction of each connector 3 is directed to the first direction D1; but this is not a restriction. It is possible to modify the computer 201 in such a way that the widthwise direction of each connector 3 is directed to the first direction D1 as shown in FIG. 4. According to a modified example of the computer 201 in which the widthwise direction of each connector 3 is directed to the first direction D1, it is possible to minimize the lengths of the wires 7 connecting the electrodes 5 of the connector 3 in each connector group 8. This may bring an advantage to reduce impedance of the wires 7.

4. Fourth Embodiment

Figure 5:
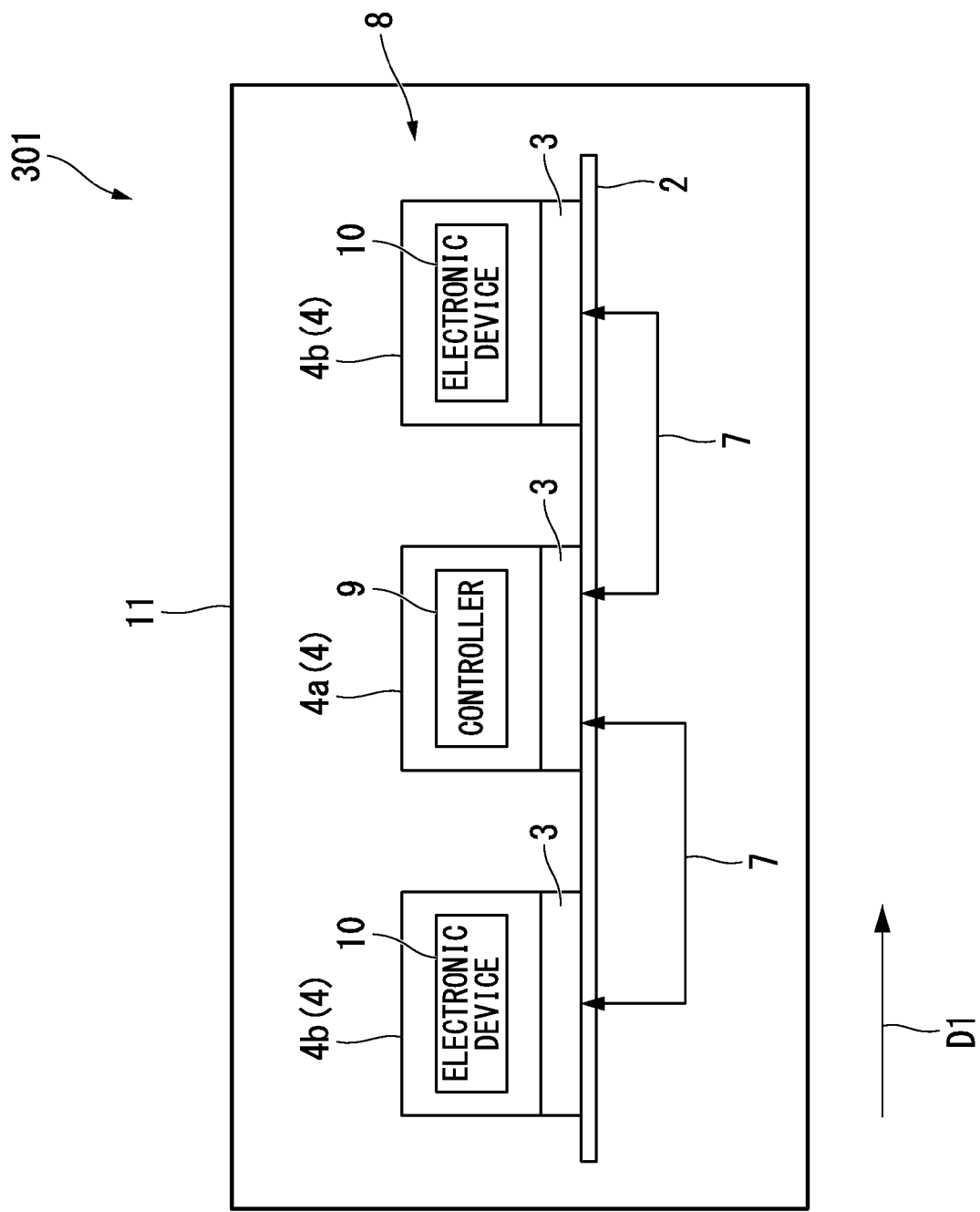
FIG. 5 is a front view of a computer according to the fourth embodiment of the present invention.
Figure 6:
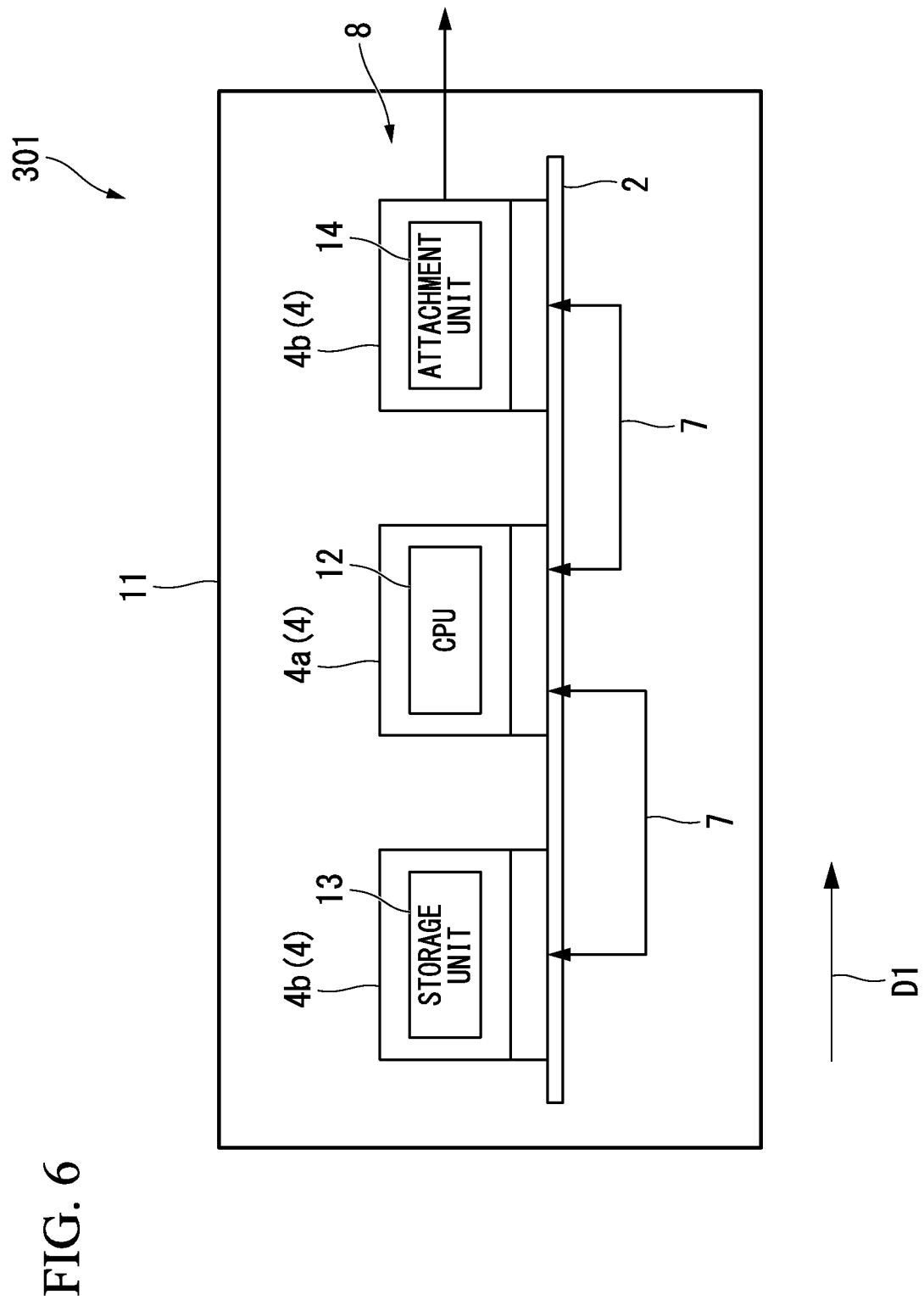
FIG. 6 is a front view showing a modified example of the fourth embodiment shown in FIG. 5.

Next, a computer 301 according to the fourth embodiment of the present invention will be described with reference to FIG. 5. The computer 301 differs from the computer 101 in that the first module 4a is configured to control an electronic device mounted on the second module 4b. In FIG. 5, parts identical to those shown in FIGS. 1 to 3 are specified using the same reference signs; hence, duplicate descriptions thereof will be omitted.

FIG. 5 is a front view of the computer 301 according to the fourth embodiment of the present invention. The computer 301 includes two types of modules 4, i.e. one first module 4a and two second modules 4b. The first module 4a includes a controller 9 which is able to output a control signal via the electrodes 5 of the connector 3 attached with the first module 4a.

The second module 4b includes an electronic device 10 controlled by the controller 9. Both the second modules 4b may include the electronic devices 10 having different functions, or they may include the electronic devices 10 having the same function. Alternatively, it is possible to apply a plurality of electronic devices 10 having the same function or different functions to each of the second module 4b. The controller 9 outputs a control signal via a combination of electrodes 5 depending on a specific function of the electronic device 10, wherein the electrodes 5 can be combined differently with respect to each function of the electronic device 10. Combinations of electrodes 5 are determined in advance with respect to different functions of the electronic device 10. In FIG. 5, reference sign "11" denotes a housing of the computer 301.

The fourth embodiment is directed to the computer 301 in which two second modules 4b including the electronic devices 10 controlled by the controller 9 are positioned on the opposite sides of the first module 4a including the controller 9; but this is not a restriction. It is possible to modify the computer 301 such that the controller 9 of the first module 4a is able to control all the electronic devices 10 of the second modules 4b attached to the connectors 3 belonging to each connector group 8 irrespective of the position of the connector 3 attached with the first module 4a. In this connection, it is possible to preclude an operating system (OS) from the second module 4b controlled by the first module 4a.

The fourth embodiment is designed such that a single first module 4a is attached to a single connector group 8; but this is not a restriction. For example, it is possible to modify the fourth embodiment such that a plurality of first modules 4a is attached to a single connector group 8. Additionally, it is possible to modify the fourth embodiment in a similar manner to the third embodiment such that a plurality of connector groups 8 can be aligned in the second direction D2. Moreover, it is possible to align two connectors 3 in the first direction D1, or it is possible to align three or more connectors 3 in the first direction D1.

In the computer 301 of the fourth embodiment, the first module 4a is able to control the second modules 4b adjoining the first module 4a in the first direction D1. Thus, it is possible for engineers to easily determine the subjects controlled by the first module 4a. Additionally, it is possible to easily change the electronic device 10 controlled by the first module 4a by simply changing the second module 4b. Thus, it is possible to easily implement various specifications applied to any units including a plurality of modules 4 attached to the same connector group 8.

The fourth embodiment is directed to the computer 301 in which the first module 4a includes the controller 9 while the second module 4b includes the electronic device 10. It is possible to modify the fourth embodiment such that the first module 4a including a CPU 12, the second module 4b including a storage unit 13, and the second module 4b including a connection unit 14 are aligned and attached to the same connector group 8. Herein, the storage unit 13 may be a hard drive or flash memory storing various programs executed by the CPU 12, while the connection unit 14 may be an I/O unit configured to receive and transmit data processed by the CPU 12. Thus, it is possible to define a server unit using a plurality of modules 4 attached to the same connector group 8.

5. Fifth Embodiment

Figure 7:
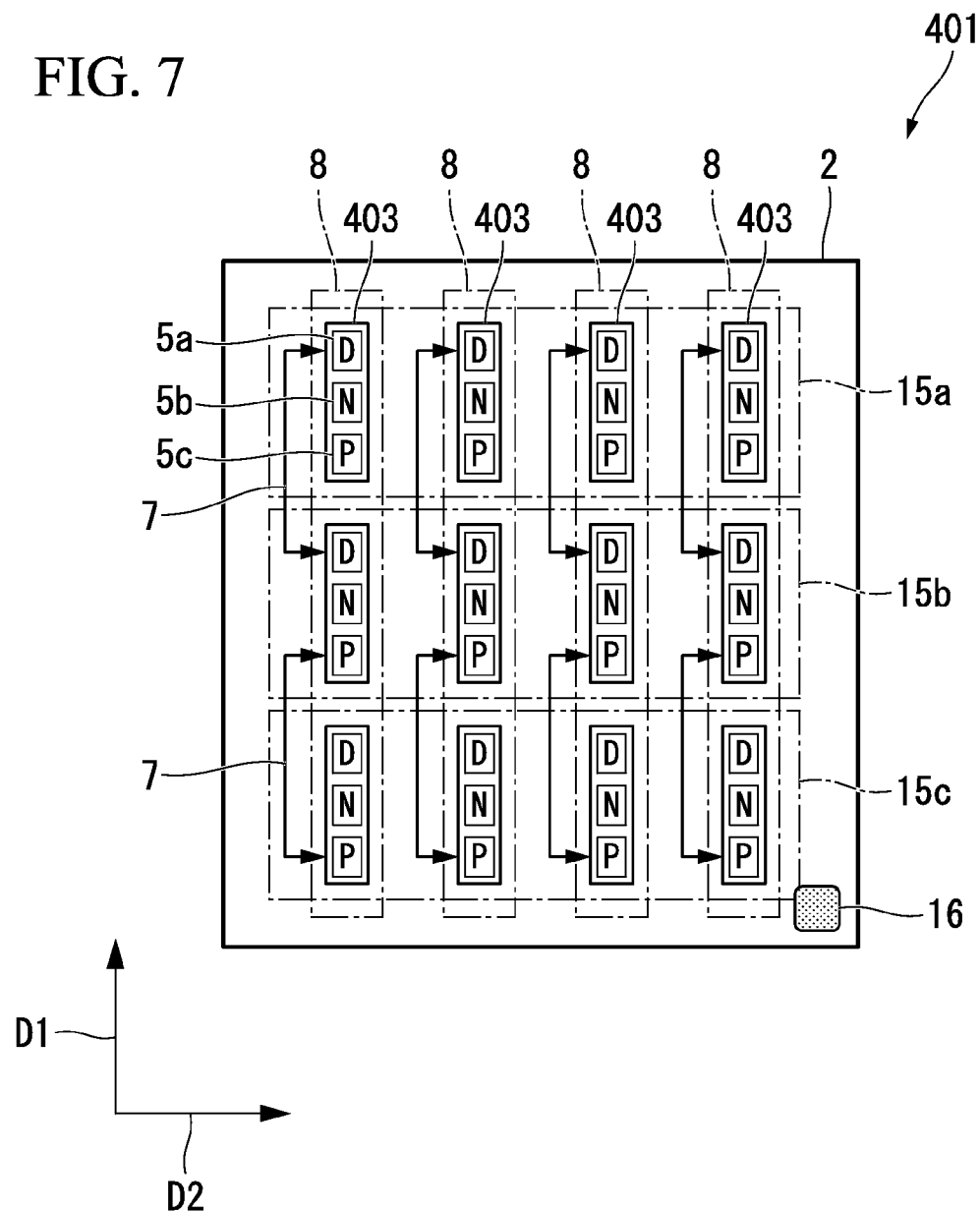
FIG. 7 is a plan view of a computer according to the fifth embodiment of the present invention.

Next, a computer 401 according to the fifth embodiment of the present invention will be described with reference to FIGS. 7 to 9. The computer 401 is a high-density server including a plurality of server units according to the foregoing embodiments. In FIG. 7, parts identical to those shown in FIGS. 1-6 are specified using the same reference signs; hence, duplicate descriptions will be omitted.

FIG. 7 is a plan view of the computer 401 including a substrate 2 and connectors 403. FIG. 8 includes front views schematically showing modules applied to the computer 401. FIG. 9 is a plan view schematically showing an array of modules attached to the computer 401.

Figure 8:
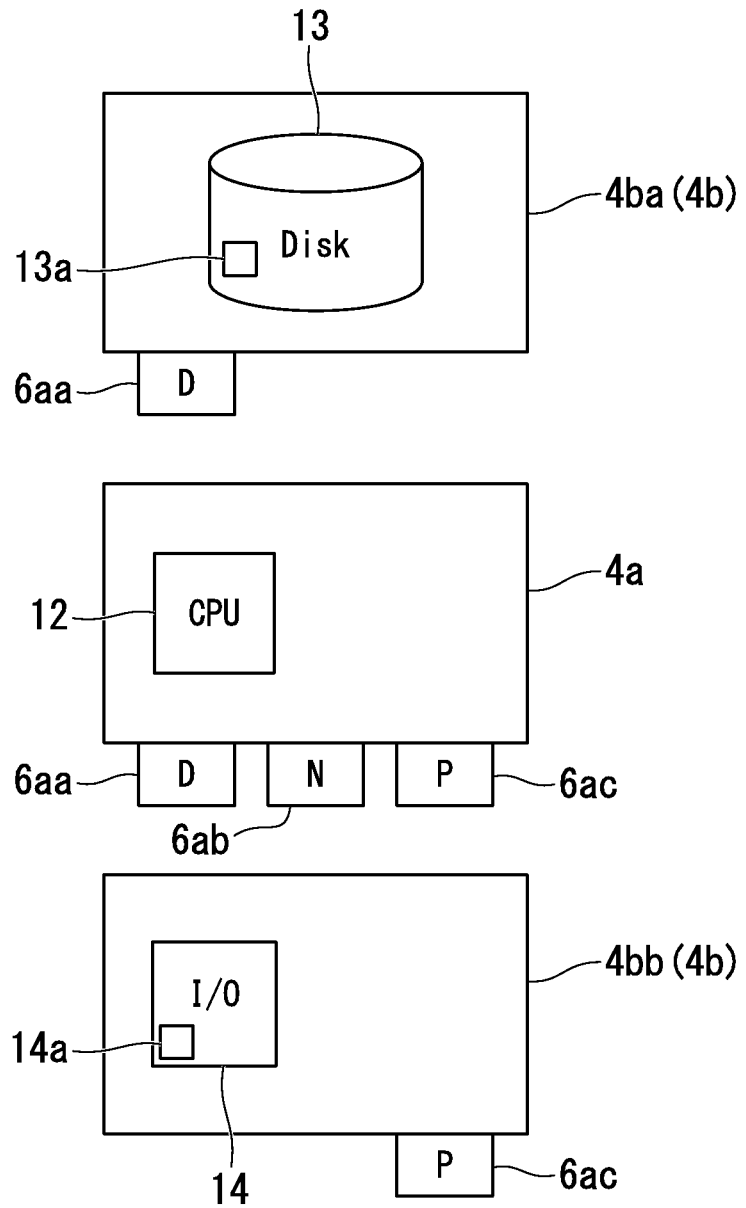
FIG. 8 includes front views schematically showing modules having different functions applied to the computer shown in FIG. 7.
Figure 9:
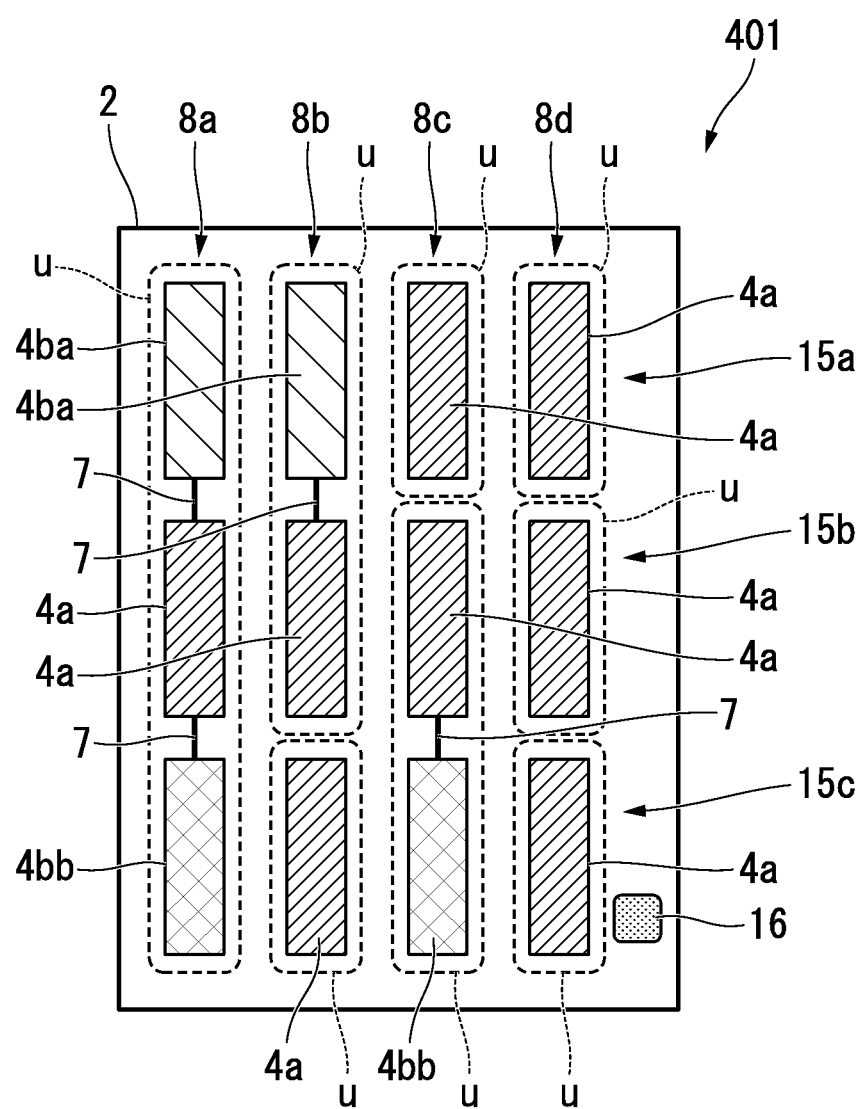
FIG. 9 is a plan view schematically showing modules applied to the computer shown in FIG. 7.

As shown in FIGS. 7 and 8, the computer 401 includes a substrate 2, connectors 403, and modules 4. As shown in FIG. 7, a plurality of connectors 403 is aligned in an array defined by the first and second directions D1 and D2 perpendicular to each other. The connector 403 is formed in a rectangular shape, whose lengthwise direction is directed to the first direction D1, in a plan view. The connector 403 includes a plurality of electrodes 5 forming a storage electrode group 5a (denoted by "D" in FIG. 7), a network electrode group 5b (denoted by "N" in FIG. 7), and an extension electrode group 5c (denoted by "P" in FIG. 7).

The storage electrode group 5a includes a plurality of electrodes 5 forming a storage drive interface such as "SATA" (Serial ATA). The storage electrode group 5a includes a combination of electrodes 5 different from combinations of electrodes 5 included in the network electrode group 5b and the extension electrode group 5c. The storage electrode group 5a may be inserted into a storage slot (not shown) formed in the connector 3.

The network electrode group 5b includes a plurality of electrodes 5 forming a communication interface such as a LAN (Local Area Network). The network electrode group 5b includes a combination of electrodes 5 different from combinations of electrodes 5 included in the storage electrode group 5a and the extension electrode group 5c. The network electrode group 5b may be inserted into a network slot (not shown) formed in the connector 3.

The extension electrode group 5c includes a plurality of electrodes 5 forming an extension interface such as "PCI Express". The extension electrode group 5c includes a combination of electrodes 5 different from combinations of electrodes 5 included in the storage electrode group 5a and the network electrode group 5*b*. The extension electrode group 5*c* may be inserted into an extension slot (not shown) formed in the connector 3.

The computer 401 includes two types of modules 4, i.e. the first module 4*a* and the second module 4*b*. The first module 4*a* includes a CPU 12. The CPU 12 of the first module 4*a* controls an electronic device mounted on the second module 4*b*. The first module 4*a* includes a storage electrode group 6*aa*, a network electrode group 6*ab*, and an extension electrode group 6*ac*. The storage electrode group 6*aa* of the module 4*a* is electrically connectable to the storage electrode group 5*a* of the connector 3. The network electrode group 6*ab* of the module 4*a* is electrically connectable to the network electrode group 5*b* of the connector 3. The extension electrode group 6*ac* of the module 4*a* is electrically connectable to the extension electrode group 5*c* of the connector 3.

In the fifth embodiment, the storage electrode group 5*a*, the network electrode group 5*b*, and the extension electrode group 5*c* are vertically aligned in the first direction D1. Additionally, the module 4 is positioned opposite to the connector 403 such that the storage electrode group 6*aa*, the network electrode group 6*ab*, and the extension electrode group 6*ac* are positioned opposite to the storage electrode group 5*a*, the network electrode group 5*b*, and the extension electrode group 5*c*. However, the positional relationship between the electrode groups 5*a*, 5*b*, 5*c* and the electrode groups 6*aa*, 6*ab*, 6*ac* are illustrative and not restrictive; hence, it is possible to modify the positional relationship between the electrode groups based on the relationship between the module 4 and the connector 403.

The fifth embodiment includes two types of second modules 4*b*, i.e. a storage module 4*ba* including a storage unit (Disk) 13 as an electronic device, and an attachment module 4*bb* including an attachment unit (I/O) 14 as an electronic device. Both the storage module 4*ba* and the attachment module 4*bb* can be controlled by the CPU 12 of the first module 4*a*. The storage module 4*ba* further includes a controller 13*a* configured to control the storage unit 13 based on a control signal from the CPU 12. The attachment module 4*bb* further includes a controller 14*a* configured to control the attachment unit 14 based on a control signal from the CPU 12.

The storage module 4*ba* solely includes the storage electrode group 6*aa* having the same configuration as the storage electrode group 6*aa* of the first module 4*a*. The attachment module 4*bb* solely includes the extension electrode group 6*ac* having the same configuration as the extension electrode group 6*ac* of the first module 4*a*.

In FIG. 7, three connectors 403 are aligned in the first direction D1 with predetermined gaps so as to define a connector group 8; hence, four connector groups 8 are aligned in the second direction D2. Thus, twelve connectors 403 are aligned in an array defined by four columns and three rows, wherein three rows are denoted as a first row 15*a*, a second row 15*b*, and a third row 15*c*. In the same connector group 8, the connector 403 of the first row 15*a* and the connector 403 of the second row 15*b* are electrically connected with the storage electrode groups 5*a* via the wire 7. In the same connector group 8, the connector 403 of the second row 15*b* and the connector of the third row 15*c* are electrically connected with the extension electrode groups 5*c* via the wire 7. In the connectors 403 belonging to three rows 15*a*, 15*b*, and 15*c*, the network electrode groups 5*b* can be connected to an external device (not shown) via the printed wiring of the substrate 2.

The first module 4*a* can be attached to any one of the connectors 403 belonging to three rows 15*a*, 15*b*, and 15*c*. In particular, the first module 4*a* can be solely attached to any one of the connectors 403 in the second row 15*b*. Additionally, the storage module 4*ba* other than the first module 4*a* can be attached to any one of the connectors 403 in the first row 15*a*. In other words, the attachment module 4*bb* cannot be attached to any one of the connectors 403 in the first row 15*a*.

The attachment module 4*bb* other than the first module 4*a* can be attached to any one of the connectors 403 in the third row 15*c*. In other words, the storage module 4*ba* cannot be attached to any one of the connectors 403 in the third row 15*c*. The aforementioned configuration in which the connectors 403 of the first row 15*a* are each configured to reject the attachment module 4*bb* while the connectors 403 of the third row 15*c* are each configured to reject the storage module 4*ba* can be implemented using various measures. For example, it is possible to physically regulate the connectivity between the modules 4 and the connectors 403 by means of keys, key grooves, cutouts, or splines which can be formed in the storage modules 4*ba*, the attachment modules 4*bb*, and the connectors 403.

The computer 401 of the fifth embodiment further includes a management module 16 configured to measure power consumption for each connector 403. The management module 16 control power for each connector 403 based on the measured power consumption. Herein, power consumption for each connector 403 may be varied depending on the types of the modules 4 attached to the connectors 403. Among the second modules 4*b*, the storage module 4*ba* and the attachment module 4*bb* differ from each other in terms of power consumption.

Next, various attachment patterns of modules 4 in the computer 401 will be described with reference to FIG. 9. Four connector groups 8*a* to 8*d* are aligned from the left to the right in FIG. 9. For the sake of convenience, different attachment patterns of modules 4 are applied to the connector groups 8*a* to 8*d*; but this is not a restriction.

In the connector group 8*a*, the storage module 4*ba* is attached to the connector 403 of the first row 15*a*; the first module 4*a* including the CPU 12 is attached to the connector 403 of the second row 15*b*; and the attachment module 4*bb* is attached to the connector 403 of the third row 15*c*.

Due to the above layout of the modules 4 in connection with the connectors 403 of the connector group 8*a*, the first module 4 and the storage module 4*ba* are electrically connected together using the storage electrode groups 5*a* of the connectors 403 via the wire 7. Additionally, the first module 4*a* and the attachment module 4*bb* are electrically connected together using the extension electrode groups 5*c* of the connectors 403 via the wire 7. That is, the connector group 8*a* contributes to a single server unit u (encompassed by dotted lines in FIG. 9) including the first module 4*a*, the storage module 4*ba*, and the attachment module 4*bb*.

In the connector group 8*b*, the storage module 4*ba* is attached to the connector 403 of the first row 15*a* while the first modules 4*a* including the CPU 12 are attached to the connectors 403 of the second row 15*b* and the third row 15*c*.

Due to the above layout of the modules 4 in connection with the connectors 403 of the connector group 8*b*, the storage module 4*ba* of the first row 15*a* and the first module 4*a* of the second row 15*b* are electrically connected together using the storage electrode groups 5*a* of the connectors 403 via the wire 7. Additionally, the first modules 4*a* are electrically connected together using the extension electrode groups 5*c* of the connectors 403 via the wire 7. Due to lack of parts or devices being controlled by the CPU 12 of the first module 4a, it is unnecessary to use the electrical connection between the first modules 4a; hence, the first modules 4a may operate independently. The connector group 8b contributes to two server units, i.e. a server unit u including the first module 4a and the storage module 4ba, and another server unit u solely including the first module 4a.

In the connector group 8c, the first modules 4a including the CPU 12 are attached to the connectors 403 of the first row 15a and the second row 15b while the attachment module 4bb is attached to the connector 403 of the third row 15c.

Due to the above layout of the modules 4 in connection with the connectors 403 of the connector group 8c, the first module 4a of the second row 15b and the attachment module 4bb of the third row 15c are electrically connected together using the extension electrode groups 5c of the connectors 403 via the wire 7. Additionally, the first modules 4a are electrically connected together using the storage electrode groups 5a of the connectors 403 via the wire 7. Due to lack of parts or devices being controlled by the CPU 12 of the first module 4a, it is unnecessary to use the electric connection between the first modules 4a; hence, the first modules 4a may operate independently. The connector group 8c contributes to two server units, i.e. a server unit u solely including the first module 4a, and another server unit u including the first module 4a and the attachment module 4bb.

In the connector group 8d, the first modules 4a including the CPU 12 are attached to all the connectors 403 of three rows 15a, 15b, and 15c. The first modules 4a of the first and second rows 15a and 15b are electrically connected together using the storage electrode groups 5a of the connectors 403 via the wire 7. Additionally, the first modules 4a of the second and third rows 15b and 15c are electrically connected together using the extension electrode groups 5c of the connectors 403 via the wire 7. Due to lack of parts or devices being controlled by the CPU 12 of the first module 4a, it is unnecessary to use the electric connection between the first modules 4a; hence, the first modules 4a may operate independently. That is, the connector group 8d contributes to three server units u each solely including the first module 4a.

Figure 10:
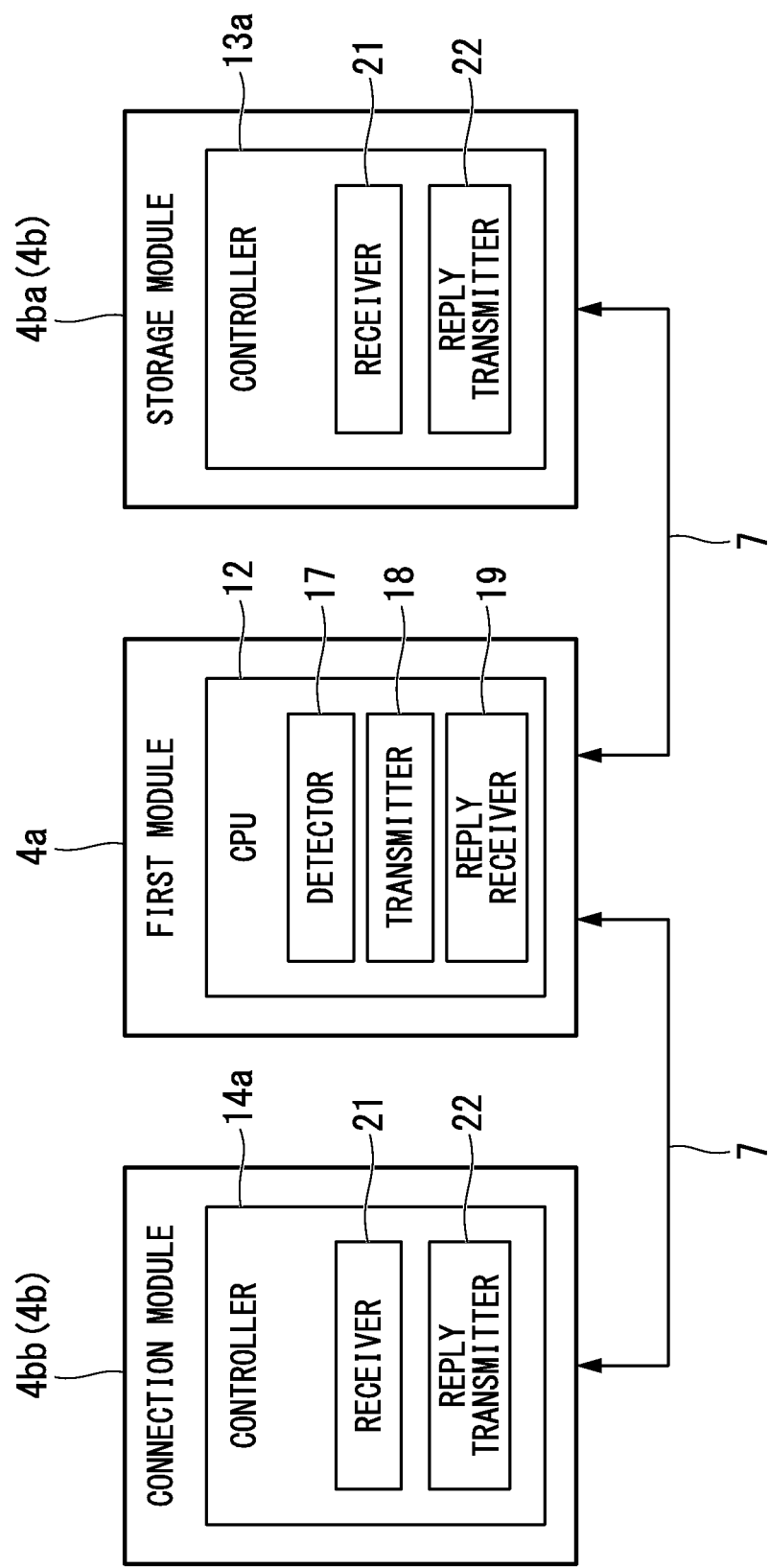
FIG. 10 is a block diagram showing a configuration of the computer configured to automatically start communication between internal devices.

FIG. 10 is a block diagram showing a configuration of the computer 401 configured to start communication between internal devices. In FIG. 10, the CPU 12 of the first module 4a includes a detector 17, a transmitter 18, and a reply receiver 19.

The detector 17 detects an attached condition as to whether the module 4a is attached to the connector 403. For example, it is possible to detect the attached condition of the first module 4a by means of a specific sensor or the like. Upon detecting the attached condition, the detector 17 outputs a signal, declaring the attached condition, to the transmitter 18.

When the detector 17 detects the attached condition of the module 4, the transmitter 18 transmits a reply request signal for each combination of electrodes 5 (i.e. each interface) to the connectors 403 aligned in the first direction D1.

The reply receiver 19 receives a reply signal for each combination of electrodes 5 for the predetermined time after the transmitter 18 transmitting a reply request signal. When the reply receiver 19 fails to receive a reply signal after lapse of the predetermined time, the reply receiver 19 determines that no modules 4 are connected to each combination of electrodes 5 or the first module 4a is connected to each combination of electrodes 5. Upon receiving a reply signal, the reply receiver 19 determines that the storage module 4ba or the attachment module 4bb is connected to each combination of electrodes 5.

The controller 13a of the storage module 4ba includes a receiver 21 and a reply transmitter 22. The controller 14a of the attachment module 4bb includes a receiver 21 and a reply transmitter 22. The receiver 21 of the controller 13a has the same configuration as the receiver 21 of the controller 14a. Additionally, the reply transmitter 22 of the controller 13a has the same configuration as the reply transmitter 22 of the controller 14a. For the sake of convenience, the following description refers solely to the receiver 21 and the reply transmitter 22 included in the controller 13a.

The receiver 21 receives a reply request signal transmitted from the first module 4a. Upon receiving a reply request signal, the receiver 21 outputs a signal, declaring reception of a reply request signal, to the reply transmitter 22.

When receiver 21 receives a reply request signal, in other words, when the reply transmitter 22 receives a signal declaring reception of a reply request signal, the reply transmitter 22 transmits a reply signal (e.g. "ACK") declaring normal reception of a reply request signal via each combination of electrodes 5. The controllers 13a and 14a are each put into a standby state to wait for start of communication after sending back a reply signal.

Figure 11:
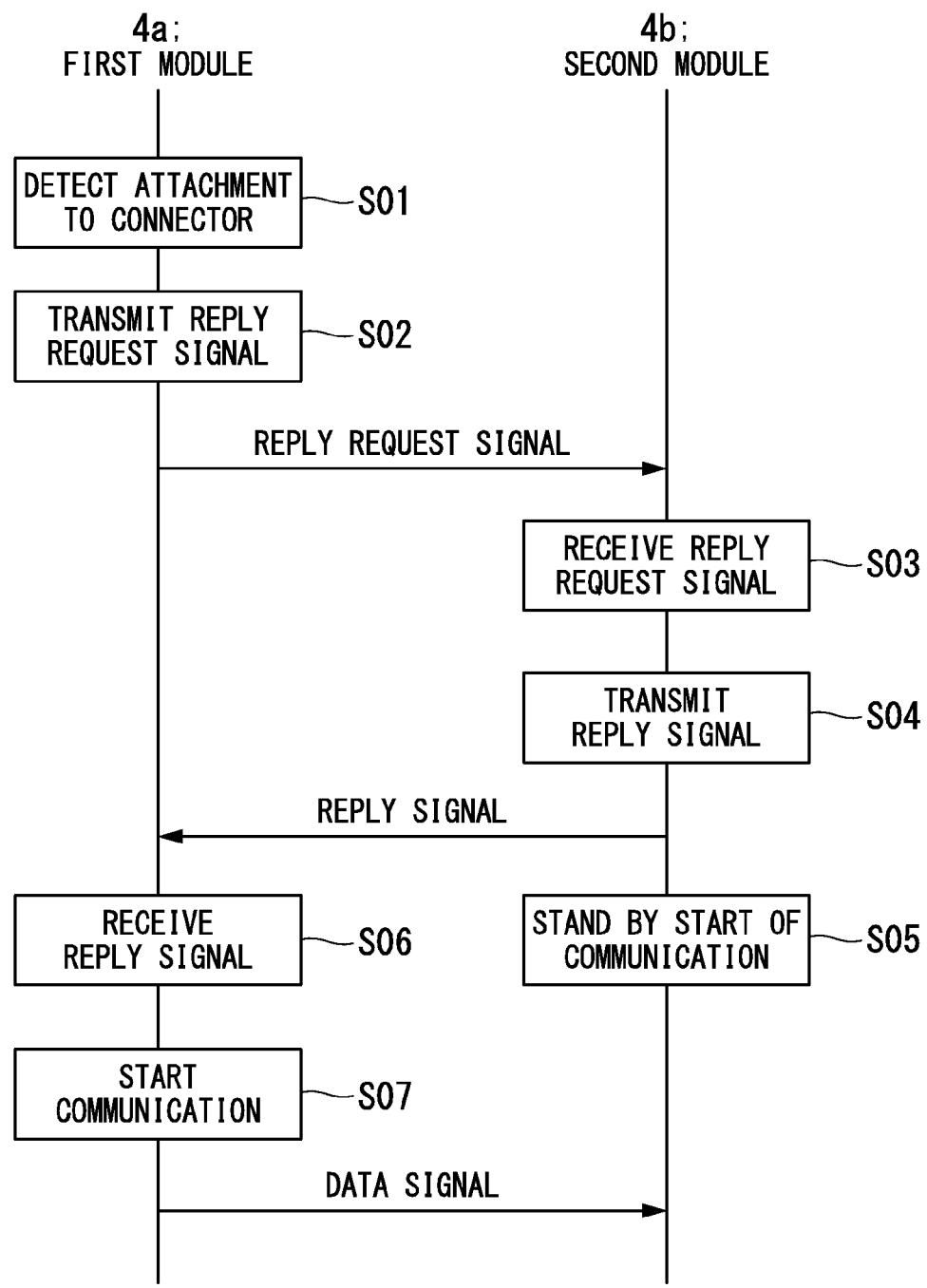
FIG. 11 is a flowchart showing a communication start control process with two modules connected to connectors of a computer.

Next, a communication start control process of the computer 401 configured to automatically start communication with the modules 4 in connection with a single connector group 8 will be described with reference to a flowchart of FIG. 11. FIG. 11 shows a communication start control process implemented with the first module 4a and the second module 4b. In this connection, the first module 4a is able to concurrently start communication with a plurality of second modules 4b.

At first, the first module 4a is attached to the connector 403 of the second row 15b in the connector group 8, and therefore a drive power is supplied to the first module 4a. The detector 17 of the first module 4a detects that the first module 4a is connected to the connector 403 in step S01 (i.e. a detection step). Next, the transmitter 18 of the first module 4a transmits a reply request signal to the second module 4b in step S02 (i.e. a transmission step).

Next, the second module 4b receives a reply request signal from the first module 4a in step S03 (i.e. a reception step). Subsequently, the second module 4b transmits a reply signal (e.g. "ACK") to the first module 4a in step S04 (i.e. a reply transmission step). At the same time, the second module 4b is put into a standby state to wait for start of communication by the first module 4a in step S05 (i.e. a second communication start step).

The first module 4a receives a reply signal from the second module 4b in step S06 (i.e. a reply reception step). The first module 4a may accept a reply signal in the predetermined time. Upon receiving a reply signal, the first module 4a starts communication via each combination of electrodes 5 receiving the reply signal in step S07 (i.e. a first communication start step). When the first module 4a fails to receive a reply signal in the predetermined time, the first module 4a does not start communication via each combination of electrodes 5. According to the communication start control process, the first module 4a is able to automatically recognize the storage module 4ba and/or the attachment module 4bb, thus starting communication. In contrast, the first modules 4a attached to the same connector group 8 do not reply to each other, or receive and transmit a rejection signal, thus preventing mutual communication. Thus, the first modules 4a may operate independently.

In the computer 401 of the fifth embodiment, it is possible for the CPU 12 of the first module 4a to control the electronic device of the second module 4b adjoining the first module 4a in the first direction D1. Additionally, it is possible to easily change the subject being controlled by the CPU 12 of the first module 4a with the storage module 4ba or the attachment module 4bb.

Additionally, it is possible to selectively install the storage unit 13 or the attachment unit 14 in connection with the CPU 12. It is possible for engineers to easily change the specification of each server unit u including a plurality of modules 4 aligned in the first direction D1.

The first module 4a can be attached to any one of connectors 403 in three rows 15a, 15b, and 15c. Thus, it is possible to define a plurality of server units u in connection with a single connector group 8. This may prevent an increase in the amount of empty space. As a result, it is possible to further reduce the size of the computer 401.

The computer 401 is designed such that the storage module 4ba and the attachment module 4bb can be attached to the connectors 403 other than the connector 403 of the second row 15b in each connector group 8. This allows for the layout of the storage module 4ba and the attachment module 4bb disposed at the external positions of each connector group 8. This facilitates a flat cable being easily wired or extracted in connection with the connectors 403 of each connector group 8. Additionally, it is possible for engineers to easily access the storage module 4ba during manual operations to extend or reduce memory devices.

The computer 401 is designed such that the first module 4a including the CPU 12 is solely attached to the connector 403 of the second row 15b while the second modules 4b are positioned to adjoin the first module 4a. This makes it possible for engineers to connect the first module 4a and the second module 4b via the shortest distance. As a result, it is possible to reduce impedance of wiring, thus suppressing an influence of noise.

In the computer 401, the first module 4a and the second modules 4b are attached to the connectors 403 aligned in the first direction D1 such that the CPU 12 is attached to the connector 403 of the second row 15b while the second modules 4b are attached to the connectors 403 of the first and third rows 15a and 15c interposing the second row 15b. This makes it possible for engineers to easily determine whether the second module 4b is either the storage module 4ba or the attachment module 4bb. As a result, it is possible for engineers to easily grasp the specifications of server units aligned in the first direction D1.

Moreover, the management module 16 is used to measure power consumption for each connector 3, thus appropriately control power based on the measurement result. As a result, it is possible to carry out appropriate power control depending on the types of the modules 4 attached to the connectors 403, thus achieving energy saving.

The computer 401 is designed to automatically start communication with the modules 4 in a single connector group 8. Thus, it is unnecessary to change the setting in changing the modules 4 by way of an external management PC. As a result, it is possible to reduce the workload of an administrator in changing specifications of server units.

The fifth embodiment refers to the connectors 403 each including the storage electrode group 5a, the network electrode group 5b, and the extension electrode group 5c; but this is not a restriction. It is possible to exclude the extension electrode groups 5c, connectable to the storage modules 4ba, from the connectors 403 of the first row 15a. Similarly, it is possible to exclude the storage electrode groups 5a, connectable to the attachment modules 4bb, from the connectors 403 of the third row 15c.

It is possible to draft programs implementing the operations of the first module 4a and the second module 4b so as to store programs in computer-readable storage media. Herein, computer systems load and execute programs to carry out various processes in connection with modules 4. The term "computer system" may embrace hardware (e.g. peripheral devices) and software (e.g. an operating system (OS)). Additionally, the computer system using WWW may embrace homepage providing environments (or homepage displaying environments). The term "computer-readable media" refer to magnetic disks, magneto-optic disks, CD-ROM, DVD-ROM, semiconductor memory, etc. Moreover, it is possible to deliver programs to computer systems via communication lines, thus allowing computer systems to execute programs.

The programs may be drafted to achieve part of the foregoing functions. Alternatively, the programs may be drafted as differential programs (or differential files), which are combined with other programs pre-installed in computer systems, thus achieving the foregoing functions.

Lastly, the present invention is not necessarily limited to the foregoing embodiments, which are illustrate and not restrictive; hence, the present invention may embrace any modifications or variations applied to the foregoing embodiments within the scope of the invention as defined by the appended claims.

What is claimed is:

1. A computer comprising:
a substrate;
a plurality of connectors each including a plurality of electrodes; and
a plurality of modules detachably attached to the substrate via the plurality of connectors,
wherein the plurality of modules is attached to the plurality of connectors via different combinations of electrodes such that a first module is attached to one connector via a first combination of electrodes, while a second module is attached to another connector via a second combination of electrodes,
wherein the plurality of connectors is aligned on the substrate in a first direction, and wherein the plurality of electrodes of one connector is electrically connected to the plurality of electrodes of another connector,
wherein the first module includes a detector configured to detect an attached condition of the first module attached to one of the plurality of connectors, a transmitter configured to transmit a reply request signal for each combination of electrodes towards the plurality of connectors in the attached condition of the first module, and a reply receiver configured to receive a reply signal for each combination of electrodes in a predetermined time after receiving the reply request signal, thus starting communication via each combination of electrodes used to receive the reply signal, and
wherein the second module includes a receiver configured to receive the reply request signal from the first module, and a reply transmitter configured to transmit the reply signal to the first module via each combination of electrodes used to receive the reply request signal, thus starting communication via each combination of electrodes used to transmit the reply signal.

2. A computer comprising:
a substrate;
a plurality of connectors each including a plurality of electrodes; and
a plurality of modules detachably attached to the substrate via the plurality of connectors,
wherein the plurality of modules is attached to the plurality of connectors via different combinations of electrodes such that a first module is attached to one connector via a first combination of electrodes, while a second module is attached to another connector via a second combination of electrodes, wherein the plurality of connectors is aligned on the substrate in a first direction, and wherein the plurality of electrodes of one connector is electrically connected to the plurality of electrodes of another connector, and wherein the plurality of connectors is aligned in an array defined by the first direction and a second direction perpendicular to the first direction, and wherein a lengthwise direction of each of the plurality of connectors matches the first direction.

3. A computer comprising:

a substrate;

a plurality of connectors each including a plurality of electrodes; and a plurality of modules detachably attached to the substrate via the plurality of connectors, wherein the plurality of modules is attached to the plurality of connectors via different combinations of electrodes such that a first module is attached to one connector via a first combination of electrodes, while a second module is attached to another connector via a second combination of electrodes, wherein the plurality of connectors is aligned on the substrate in a first direction, and wherein the plurality of electrodes of one connector is electrically connected to the plurality of electrodes of another connector, and wherein the plurality of connectors is aligned in an array defined by the first direction and a second direction perpendicular to the first direction, and wherein a lengthwise direction of each of the plurality of connectors matches the second direction.

* * * * *